United States Patent [19]

Peters et al.

[11] Patent Number: 5,406,446

[45] Date of Patent: Apr. 11, 1995

[54] THIN FILM CAPACITOR

[75] Inventors: Michael G. Peters, Santa Clara; William T. Chou; Wen-chou V. Wang, both of Cupertino; Michael G. Lee, San Jose; Solomon I. Beilin, San Carlos, all of Calif.

[73] Assignee: Fujitsu Limited, Kanagawa, Japan

[21] Appl. No.: 201,628

[22] Filed: Feb. 25, 1994

Related U.S. Application Data

[62] Division of Ser. No. 54,910, Apr. 29, 1993, Pat. No. 5,323,520.

[51] Int. Cl.⁶ .............................................. H01G 1/14
[52] U.S. Cl. ........................... 361/306.1; 361/301.2
[58] Field of Search ................... 361/301.2, 303, 304, 361/306.1, 322, 763, 766; 174/262–268; 257/535, 774; 29/25.42

[56] References Cited

U.S. PATENT DOCUMENTS

| | | | |
|---|---|---|---|
| 3,683,245 | 8/1972 | Bacher | 361/304 |
| 4,285,780 | 8/1981 | Schachter | 204/15 |
| 4,317,700 | 3/1982 | Tanaka et al. | 156/652 |
| 4,700,473 | 10/1987 | Freyman | 29/846 |
| 4,830,691 | 5/1989 | Kida et al. | 156/631 |
| 4,912,020 | 3/1990 | King et al. | 430/311 |
| 5,003,428 | 3/1991 | Shepherd | 361/321 |

Primary Examiner—Bruce A. Reynolds
Assistant Examiner—Michael D. Switzer
Attorney, Agent, or Firm—Christie, Parker & Hale

[57] ABSTRACT

A thin-film bypass capacitor is fabricated by forming a plurality of through holes through the thickness of a nonconductive base substrate and filling the through holes with a conductive material to form ground vias and power vias. A sequence of back side metalization layers are applied to the back side surface of the base substrate. A sequence of bottom contact layers are applied to the front side surface of the base substrate. A bottom contact power terminal is formed and a bottom contact metalization layer is applied to the surface of the bottom contact layers. A portion of the metalization layer is removed and an insulating layer is formed on the surface of the bottom contact metalization layer. A ground metalization feedthrough and a power metalization feedthrough are formed at the surface of the insulating layer. A sequence of top contact layers are applied to the surface of the insulating layer and a front side ground terminal and front side power terminal are formed. A back side ground terminal and a back side power terminal are formed at the back side of the base substrate.

7 Claims, 6 Drawing Sheets

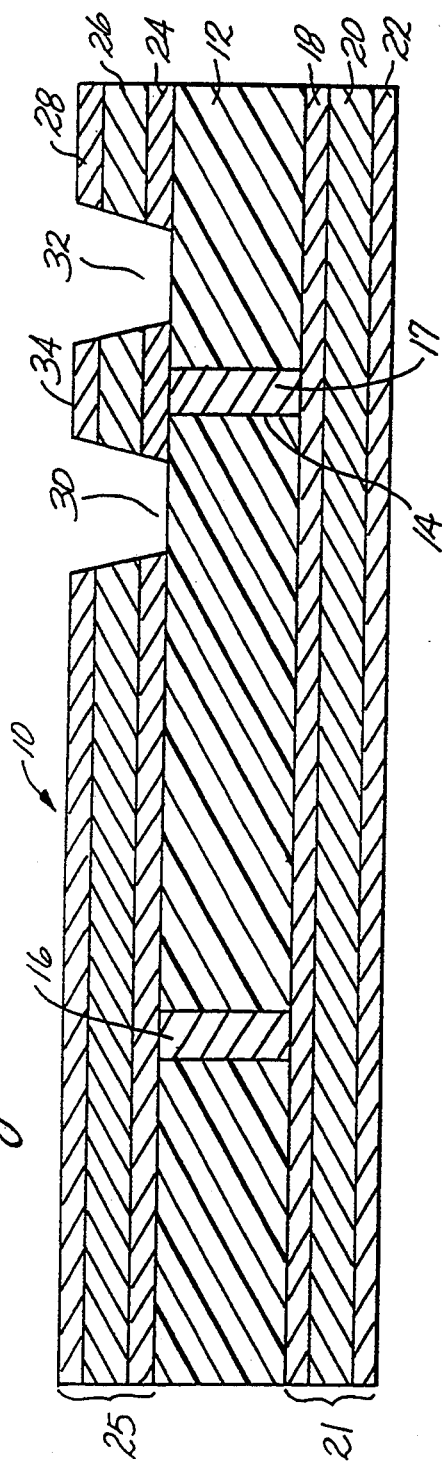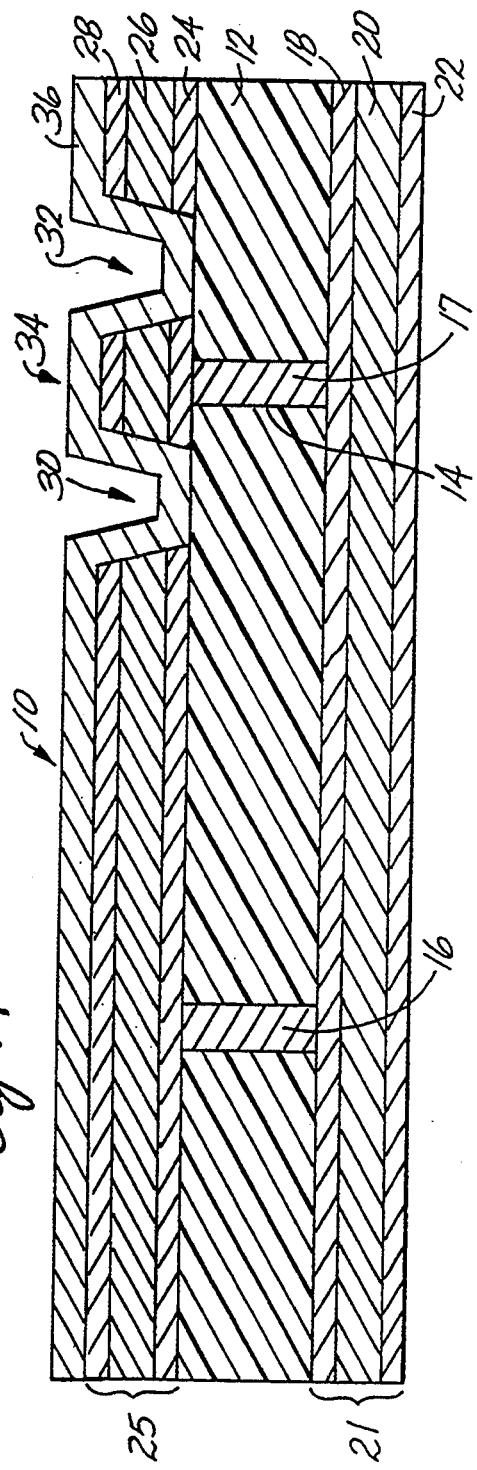

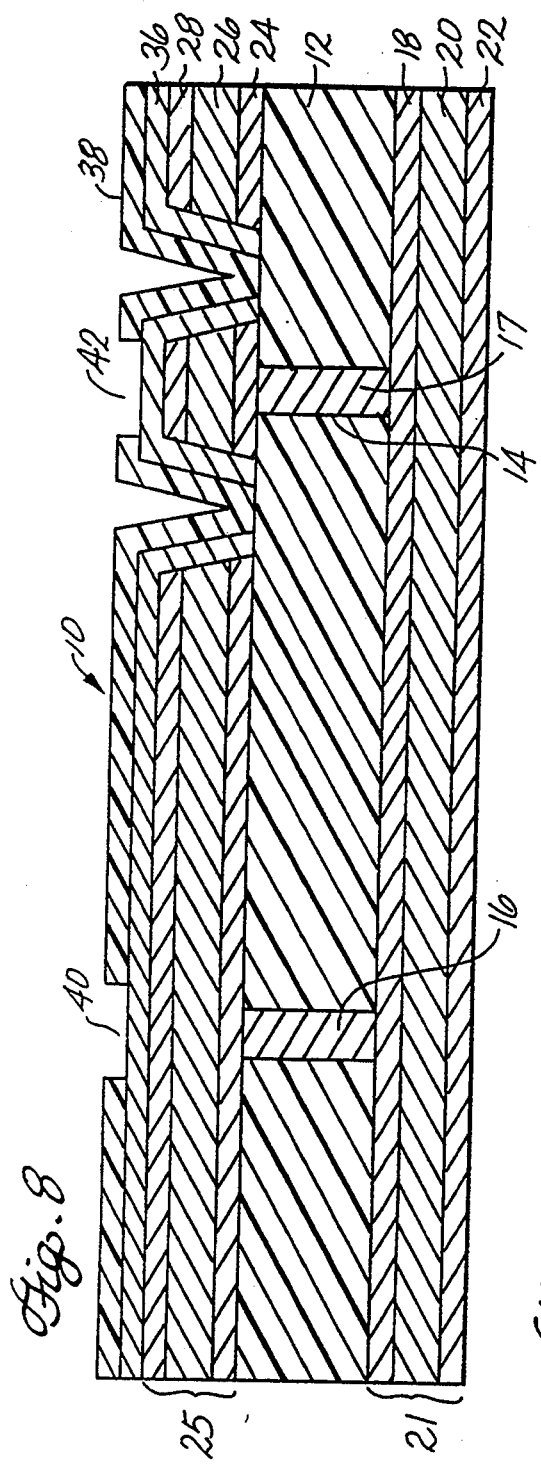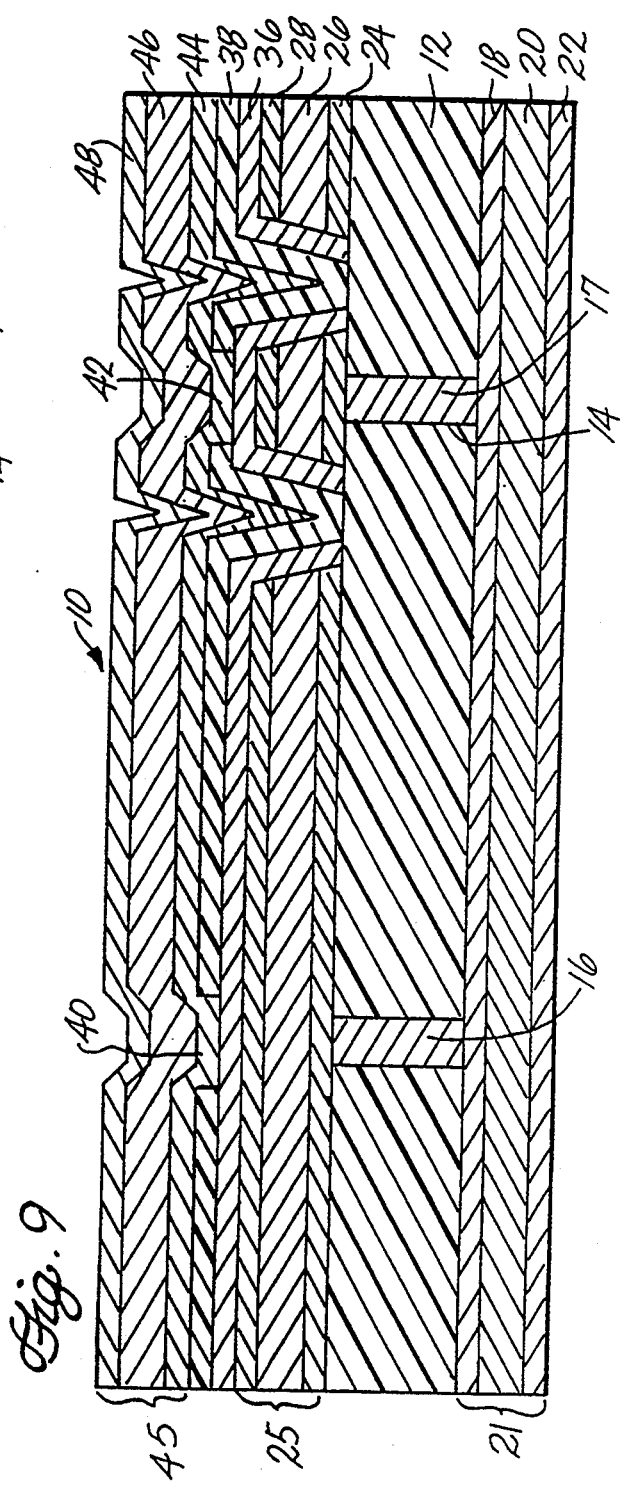

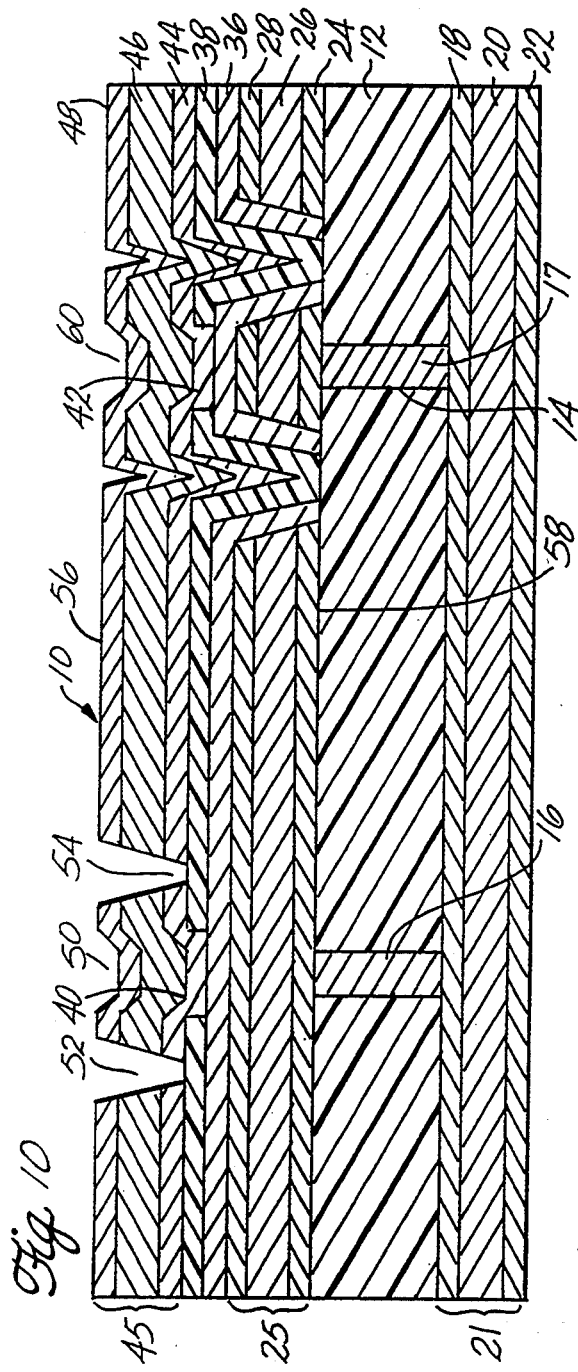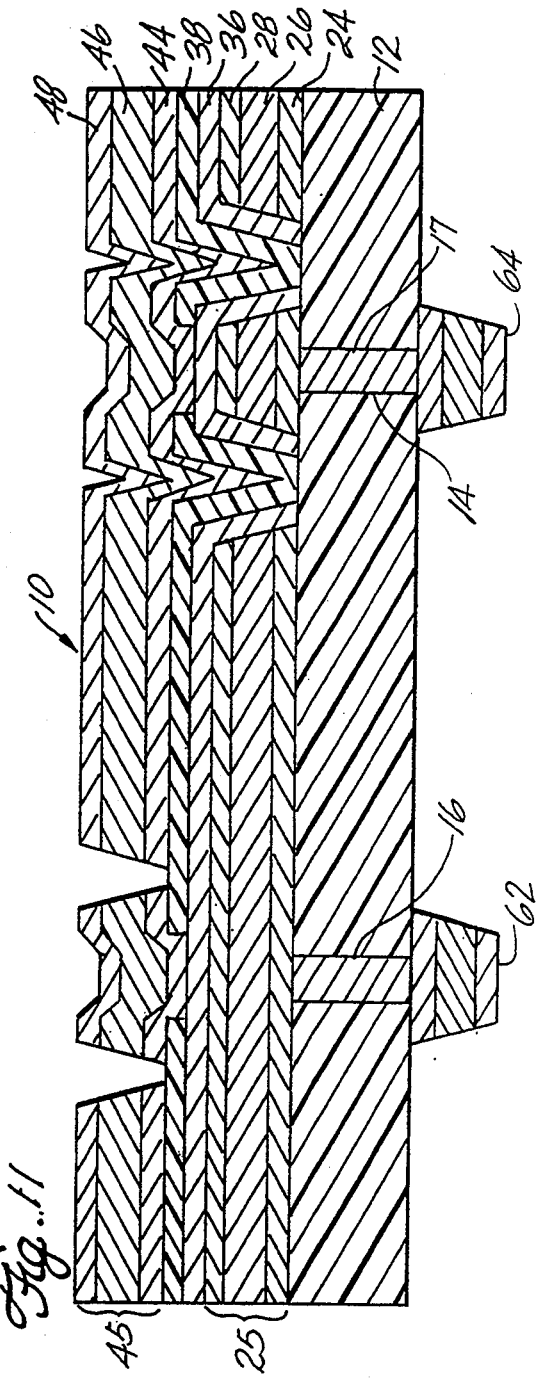

THIN FILM CAPACITOR

This is a division of U.S. patent application Ser. No. 08/054,910, filed Apr. 29, 1993, now U.S. Pat. No. 5,323,520.

FIELD OF THE INVENTION

The present invention relates generally to the fabrication of substrates having bypass capacitors. In particular, the present invention provides bypass capacitors in close proximity to integrated circuits.

BACKGROUND OF THE INVENTION

In electronic circuits, bypass capacitors provide impedance paths for alternating currents so that the high frequency alternating currents are not transmitted to selected portions of the electronic circuit. On printed circuit boards, various types of discrete electrical components having various configurations and electrical connection arrangements have been employed as bypass capacitors.

For example, a discrete capacitor well known in the art is the axial lead capacitor which is cylindrical in shape and has an electrical lead extending from each of the flat ends of the cylinder. Axial lead capacitors are typically installed on the printed circuit board by bending the leads away from the capacitor so that when the capacitor is placed on the circuit board along its longitudinal side, the leads make contact, either by feedthrough or surface mount, with corresponding circuit traces etched on the printed circuit board.

A second type of capacitor well known in the art is the tombstone capacitor which is configured in the shape of a box having electrical leads extending from only one of the faces of the box. Like the axial capacitor, the leads of the tombstone capacitor must also be bent in order to make contact with circuit traces on the circuit board.

The third type of capacitor known in the art is a leadless capacitor used for surface mounting to a printed circuit board. The leadless capacitor is configured in the shape of a box having electrical contacts disposed on one face of the box. The leadless capacitor is electrically connected to the printed circuit board by soldering each electrical contact of the capacitor to a respective circuit trace on the printed circuit board.

Since high performance electronics operate at increasing frequencies, it becomes necessary to include the capacitance of both the circuit traces on the printed circuit board and electrical leads of the capacitors when designing an electronic circuit. In order to avoid or minimize the capacitance effects of the capacitor leads, the circuit designer will seek to place the bypass capacitors employed in the circuit as close as possible to the corresponding integrated circuit package. However, as the frequency of operation of the electronic circuits increases, the circuit designer also attempts to place the integrated circuit packages as close together as possible on the printed circuit board. Thus, in the design and manufacturing of the electrical circuit, both the bypass capacitors and the integrated circuit packages compete with each other for placement close to other integrated circuit packages on the printed circuit board.

Consequently, in order to accommodate the need to both reduce undesired circuit capacitance due to capacitor leads and use space more efficiently, circuit designers have elected to incorporate bypass capacitors into the printed circuit board itself. The design of such a bypass capacitor avoids need for electrical leads and, therefore, eliminates the undesired contribution of capacitance inherent with such leads. In effect, the leads are part of the capacitor. Additionally, the design of such a bypass capacitor, built as an integral member of the printed circuit board, facilitates the efficient use of space in designing an electrical circuit.

However, the advent of high performance computers has also created a greater need for high density conductors within the printed circuit board without an increase in the complexity and cost of manufacturing. Thus, in a manner similar to the competition for space for components mounted on the surface of the printed wiring board (i.e., integrated circuits and capacitors), bypass capacitors fabricated as integral printed circuit board components similarly compete for space with the high density conductors within the printed circuit board itself.

It is, therefore, desirable that a bypass capacitor be fabricated in such a manner that will facilitate its spatially efficient use with a printed circuit board comprising numerous integrated circuits. It is desirable that the bypass capacitor be fabricated in such a manner that will minimize the undesired capacitance contribution associated with the means used to electrically connect the capacitor to a printed circuit. It is also desirable that the method of manufacturing the bypass capacitor, as well as the materials used, be both practical and economically feasible.

SUMMARY OF THE INVENTION

There is, therefore, provided in practice of this invention according to a presently preferred embodiment, a method for fabricating a thin-film bypass capacitor configured to interconnect with integrated circuits and printed circuit boards in a spatially efficient manner that minimizes any undesirable capacitance contribution from the capacitor's electrical connections. The thin-film bypass capacitor is fabricated by forming a plurality of through holes through the thickness of a nonconductive substrate and filling the through holes with a conductive metal to form ground vias and power vias. A sequence of back side metalization layers comprising a back side adhesion layer, a back side conductive layer, and a back side metal layer are applied to the back side surface of the base substrate.

A sequence of bottom contact layers comprising a bottom contact adhesion layer, a bottom contact conductive layer, and a bottom contact metal layer are applied to the front side surface of the base substrate. Portions of the bottom contact layers are removed to form a bottom contact power terminal located adjacent to the power via. A bottom contact metalization layer is deposited onto the surface of the bottom contact conductive layer and portions of the metalization layer are selectively removed from the front side surface of the base substrate.

An insulating layer comprising a electrically nonconductive material is formed on the surface of the bottom contact metalization layer. The insulating layer serves to electrically isolate the bottom contact layers from the top contact layers, thereby forming the bypass capacitor. Portions of the bottom contact metalization layer are exposed to form a ground metalization feedthrough, located adjacent to the ground via, and a power metalization feedthrough, located adjacent to the power via.

A sequence of top contact layers comprising a top contact adhesion layer, a top contact conductive layer, and a top contact metal layer are deposited onto the surface of the insulating layer. Portions of the top contact layer are removed to form a front side ground terminal, located adjacent to the ground via, and a front side power terminal, located adjacent to the power via. A back side ground terminal, located adjacent to the ground via, and a back side power terminal, located adjacent to the power via are from the backside metalization layer. The front side ground terminal is electrically connected with the back side ground terminal through the top contact layers, the ground metalization feedthrough, the bottom contact layers, and the ground via. Similarly, the front side power terminal is electrically connected with the back side power terminal through the top contact layers, the power metalization feedthrough, the bottom contact power terminal, and the power via.

The capacitor according to this invention is formed by the arrangement of the bottom contact layer, insulating layer and the top contact layer. The dielectric substrate, ground and power vias, and the backside ground and power terminals serve to promote connection with other electrical components and permit transfer of electrical power from such components to the capacitor.

The thin-film capacitor fabricated in this manner permits the storage of electrical energy in a configuration that can interconnect with integrated circuits and printed circuit boards in a spatially efficient manner. Further, the electrical contacts of the bypass capacitor are defined by the thickness of the capacitor itself which minimizes any undesirable capacitance contribution associated with the capacitor's electrical leads.

BRIEF DESCRIPTION OF THE DRAWINGS

These and other features and advantages of the present invention will become appreciated as the same becomes better understood with reference to the specification, claims and drawings wherein:

FIGS. 3 through 11 are schematic cross sectional views of the thin-film bypass capacitor substrate after each of a succession of process steps used to manufacture the bypass capacitor according to practice of this invention, in each of these figures the layer thicknesses and lateral distances are exaggerated for purpose of illustration;

FIG. 3 is a cross sectional view of the thin-film bypass capacitor substrate after through holes have been formed in the dielectric substrate and metalized;

FIG. 4 is a cross sectional view of the thin-film bypass capacitor substrate after the back side has been metalized to form a back side metalization layer;

FIG. 5 is a cross sectional view of the thin-film bypass capacitor substrate after the front side has been metalized to form a bottom contact layer;

FIG. 6 is a cross sectional view of the thin-film bypass capacitor substrate after the bottom contact power terminal has been formed;

FIG. 7 is a cross sectional view of the thin-film bypass capacitor substrate after the application and etching of a bottom contact metalization layer;

FIG. 8 is a cross sectional view of the thin-film bypass capacitor substrate after the formation of layer of insulating material;

FIG. 9 is a cross sectional view of the thin-film bypass capacitor substrate after the application of a top contact layer;

FIG. 10 is a cross sectional view of the thin-film bypass capacitor substrate after the formation of a front side ground terminal and a front side power terminal;

FIG. 11 is a cross sectional view of the thin-film bypass capacitor substrate after the formation of a back side ground terminal and a back side power terminal.

DETAILED DESCRIPTION

Figure 1:
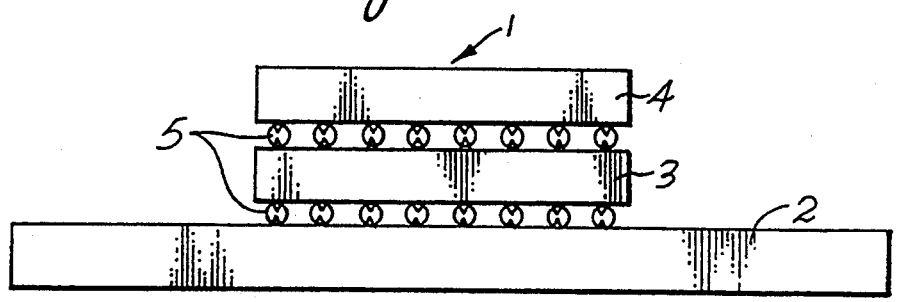
FIG. 1 is a side view of a multi-chip module using a thin-film bypass capacitor manufactured to principles of the invention.

In its most basic form, a capacitor comprises a pair of electrically conductive plates or conductors that are separated by a nonconductive dielectric material. FIG. 1 shows an exaggerated side view of a multi-chip module using a thin-film bypass capacitor manufactured according to principles of the invention. A multi-chip module (MCM) 1 comprises a printed circuit board 2 for providing electrical current to an integrated circuit 4. A thin-film bypass capacitor 3 is used to alter the flow of electrical current from the printed circuit board 2 to the integrated circuit 4.

The top surface of the thin-film bypass capacitor is directed toward a mating surface of the integrated circuit 4 and the bottom surface of the thin-film bypass capacitor is opposite to the top surface and directed toward a mating surface of the printed circuit board 2. The top surface of the thin-film bypass capacitor comprises a plurality of power and ground terminals that are connected to respective power and ground terminals of the integrated circuit by contact pads 5. Similarly, the bottom surface of the thin-film bypass capacitor comprises a plurality of power and ground terminals that are connected to respective power and ground terminals of the printed circuit board by contact pads 5. The contact pads preferably comprise a conductive solder material that when melted flows to create an electrical connection between the thin-film bypass capacitor terminals and the corresponding terminals of both the integrated circuit and the printed circuit board.

The terminology "ground" or "power" terminals used to refer to the electrical connections of the capacitor is used purely as a matter of convenience. The electrical connections could be referred to as an "emitter" and collector" in the context of a bipolar transistor or as a "source" and "drain" in the context of a field effect transmitter. Additionally, the thin-film capacitor manufactured according to principles of the invention may comprise a plurality of such power and ground terminals on both the front side and back side of each capacitor plate. The thin-film capacitor may be configured in the shape of a strip, rectangle and the like.

Figure 2:
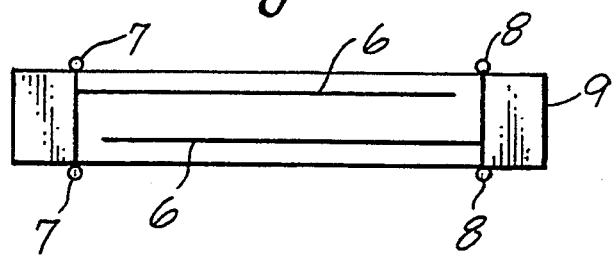
FIG. 2 is a electrical diagram of the thin-film bypass capacitor.

The thin-film capacitor according to practice of this invention can also be represented in the form of an electrical diagram as show in FIG. 2. The electrical diagram shows the basic configuration of the capacitor comprising a pair of conductive plates 6, each plate being connected to either a pair of ground electrical terminals 7 or power electrical terminals 8. A dielectric substrate 9 encloses and separates the pair of conductive plates to form the capacitor.

Figure 3:
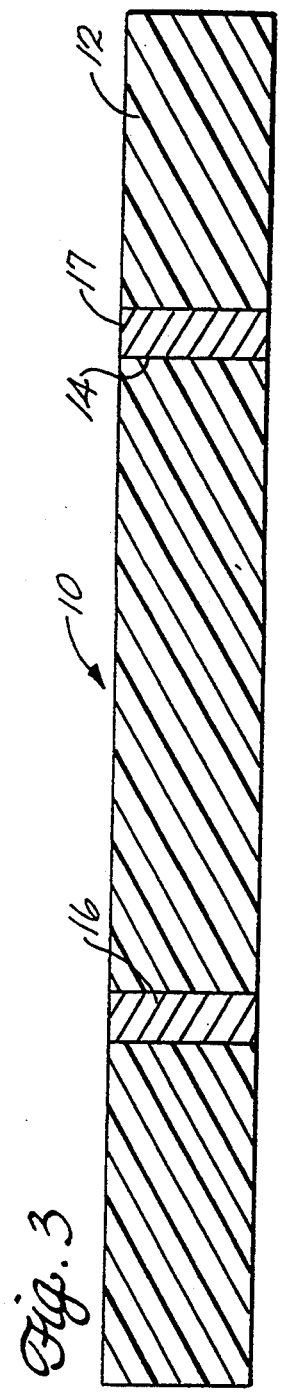

FIG. 3 shows an exaggerated cross sectional view of a bypass capacitor substrate 10 with electrical through-hole interconnects according to principles of this invention. The bypass capacitor substrate 10 comprises a base substrate 12 made of a non-conductive material. The nonconductive material selected for the construction of the substrate must have the mechanical and electrical properties desired for use as a substrate for a capacitor. Suitable nonconductive materials may include organic or inorganic polymers, silicon, ceramics, glass, glass-ceramics, polyimide-epoxy, epoxy-fiberglass, Teflon and the like.

The base substrate 12 has a plurality of through holes 14 extending through its thickness, defined as the distance between a first surface of the base substrate and a second surface of the base substrate opposite to first surface. For purposes of reference, the first surface of the base substrate will be referred to the front side at the top of FIG. 3, and the second surface will be referred to the back side at the bottom of FIG. 3. This convention for referencing the first and second surfaces of the base substrate will remain constant throughout the description of the invention as illustrated by FIGS. 3 through 11. It will also be recognized that the cross sections illustrated may be only a small fraction of a large substrate having many components and features not needed for an explanation of this invention. Additionally, it should be noted that the figures referred to represent exaggerated cross sectional views of the thin-film capacitor for purposes of clarity.

The through holes 14 may be formed in the base substrate by methods which are well known to those skilled in the art. For example, the through holes may be laser drilled, punched, or etched using reactive ion, dry, chemical, or photolithographic etching techniques. The through holes 14 are filled with an electrically conductive material to form a ground via 16 and a power via 17. The conductive material selected to fill or metalize the through hole may include metals, alloys of metal, metal-nonmetal compositions and the like. The through hole may be metalized by using deposition techniques well known to those skilled in the art such as sputter deposition, chemical vapor deposition, plasma deposition, electroplating, metal organic chemical vapor deposition and the like.

Figure 4:
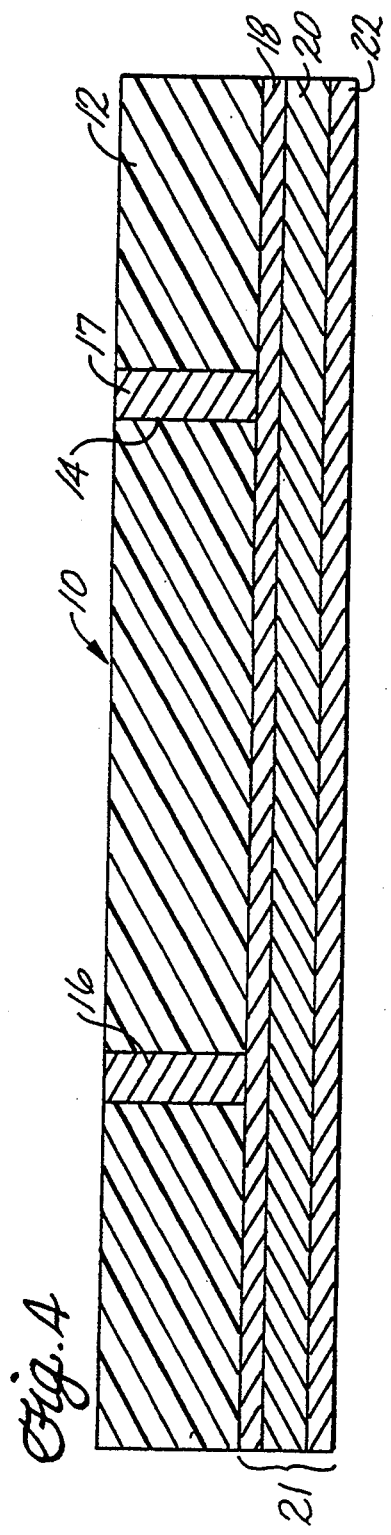

FIG. 4 shows the bypass capacitor substrate with back side metalization layers 21. The back side surface of the dielectric substrate is metalized for the purpose of providing a back side ground terminal 62 and a back side power terminal 64 (FIG. 11) that will serve to electrically connect the bypass capacitor to a printed circuit board or the like.

The back side metalization layers 21 comprise a back side adhesion layer 18, a back side conductive layer 20, and a back side metal layer 22. The back side surface of the base substrate 12 is cleaned in a manner well known to those skilled in the art to prepare the substrate for the metalization process. A back side adhesion layer 18 is deposited onto the back side surface of the base substrate 12 by methods well known to those skilled in the art such as by sputter deposition, chemical vapor deposition, plasma deposition, electroplating and the like. A preferred method is by sputter deposition. The material chosen to serve as the back side adhesion layer should be capable of forming a good bond with the material chosen to form the back side conductive layer 20. For example, if the back side conductive layer comprises copper, suitable materials for the back side adhesion layer material may include chromium and titanium. A preferred back side adhesion material is chromium. A preferred back side adhesion layer 18 has a thickness of approximately 0.02 micrometers.

A back side conductive layer 20 is deposited onto the surface of the back side adhesion layer 18 using deposition techniques similar to those used for depositing the back side adhesion layer 18.. A preferred method is by sputter deposition. The material chosen for the back side conductive layer should be a good electrical conductor (i.e., have a low resistivity value) and may include metals, metal alloys and the like. A preferred material for the back side conductive layer is copper. The thickness of the back side conducive layer 20 is designed according to electrical requirements for the circuit and capacitor substrate 10. A preferred back side conductive layer has a thickness of approximately one micrometer.

However, the back side conductive layer may be applied by using a two step deposition technique if, according to the electrical requirements for the capacitor substrate, the thickness of the back side conductive copper needs to be greater than about two micrometers. In such a case, the back side conductive layer is deposited by first sputtering a thin seed layer of less than about two micrometers onto the surface of the back side adhesion layer and then electroplating the conductive material onto the surface of the seed layer until the desired back side conductive layer thickness is achieved.

A back side metal layer 22 is deposited onto the surface of the back side conductive layer 20 by using deposition techniques similar to those described for depositing the back side adhesion layer and back side conductive layer. Like the back side adhesion layer 18, the material chosen for the back side metal layer should be one that forms an intimate interface with the back side conductive layer 20. If the back side conductive layer is copper, suitable materials for the back side adhesion layer material may include chromium and titanium. A preferred back side adhesion material is chromium. A preferred back side metal layer has a thickness of approximately 0.02 micrometers. The purpose of the back side metal layer 22 is to protect the back side conductive layer from delaminating from the back side adhesion layer when the back side metalization layers 21 undergo a subsequent etching operation.

Alternatively, the back side adhesion layer 18, the back side conductive layer 20, and the back side metal layer 22 may comprise a single layer of one material (i.e., metal or metal alloy) having characteristics of electrical conductivity similar to that of the multi-layer embodiment. However, such a mono-layer embodiment can not be used when copper is chosen for the back side conductive layer. The use of copper for the back side conductive layer makes the use of an adhesion layer necessary because the copper does not adhere well to the dielectric substrate 12. Further, the use of copper also requires the use of a back side metal layer to protect it from being removed during a subsequent step of selectively etching the back side metalization layer 21.

Figure 5:
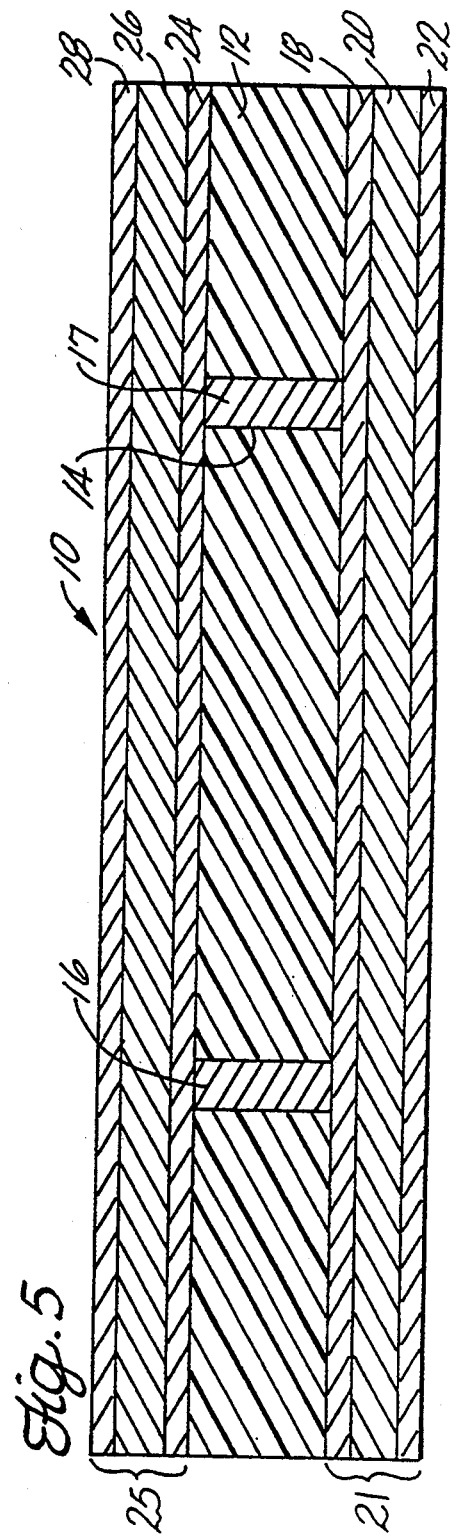

FIG. 5 shows the bypass capacitor substrate 10 after the front side surface of the dielectric substrate 12 has been metalized. As a matter of terminology, the layers of conductive material that are first metalized onto the front side surface of the base substrate 12 are referred to as bottom contact layers 25. The front side of the capacitor substrate 10 will comprise two separate electrically conductive layers, a bottom contact layer 25 and a top contact layer 45 (FIGS. 8 through 10). The bottom and top contact layers each comprise a series of metalization layers and are electrically isolated from each other by an insulating dielectric layer 38. The bottom and top contact layers form the pair of electrically conductive plates needed to make up the bypass capacitor.

The top surface of the base substrate 12 is cleaned by using the same technique used for cleaning and preparing the back side surface of the base substrate prior to back side metalization. The bottom contact layer 25 comprises a bottom contact adhesion layer 24, a bottom contact conductive layer 26 and a bottom contact metal layer 28. A bottom contact adhesion layer 24 is deposited onto the front side surface of the base substrate using a deposition technique similar to that described for depositing the back side adhesion layer 18 onto the back side surface of the base substrate. Preferably, the bottom contact adhesion layer is deposited by sputter deposition. The materials chosen for the bottom contact adhesion layer are the same as those chosen for the back side adhesion layer 18. A preferred bottom contact adhesion layer is chromium. A preferred bottom contact adhesion layer 24 has a thickness of approximately 0.02 micrometers.

A bottom contact conductive layer 26 is deposited onto the surface of the bottom contact adhesion layer 24 by deposition techniques similar to that described for depositing the back side conductive layer 20 onto the back side adhesion layer 18. Preferably, the bottom contact conductive layer is deposited by sputter deposition. The materials chosen for the bottom contact conductive layer are the same as those chosen for the back side conductive layer 20. A preferred bottom contact conductive layer is copper. A preferred bottom contact conductive layer 26 typically has a thickness in the range of from two to six micrometers. In order to achieve such thicknesses it may be necessary to employ a two step deposition technique made up of sputtering a first thin seed layer (up to about two micrometers) of conductive material onto the surface of the bottom contact adhesion layer 24. The final desired thickness of the bottom contact conductive layer 26 may be achieved by electroplating the conductive material onto the surface of the first seed layer of the conductive material.

A bottom contact metal layer 28 is deposited onto the surface of the bottom contact conductive layer 26 by using deposition techniques similar to those described for depositing the back side metal layer 22 onto the surface of the back side conductive layer 20. Preferably, the bottom contact metal layer is deposited by sputter deposition. The materials chosen for the bottom contact metal layer are the same as those chosen for the back side metal layer 22. A preferred bottom contact metal layer is chromium. A preferred bottom contact metal layer 28 has a thickness of approximately 0.02 micrometers.

Under appropriate circumstances, part or all of the back side metalization layer 21 and the bottom contact layer 25 may be deposited simultaneously instead of sequentially. Additionally, the order of deposition on the front and back sides of the substrate may be interchanged.

FIG. 6 shows the capacitor substrate 10 after the bottom contact layer 25 has been selectively etched to form a bottom contact power terminal 34 electrically isolated from the rest of the bottom contact layers by a pair of bottom contact notches 30 and 32. The bottom contact power terminal 34 is electrically connected to a power via 17 which extends through the thickness of the base substrate 12 and is in electrical connection with the back side metalization layers 21. If already in place, a protective tape (not shown) is applied to the surface of the back side metal layer 22 to cover and protect it from acids and chemicals used during the front side etching operation. A preferred protective tape is manufactured by 3M and well known to those skilled in the art as "yellow" or "blue" tape. The etching operation may be carried out by using an selective etching technique well known to those skilled in the art such as reactive ion etching, chemical etching, dry etching, photolithographic etching and the like. A preferred selective etching technique is photolithographic etching.

The photolithographic etching of the bottom contact notches 30 and 32 is carried out by depositing photoresist material onto the surface of the bottom contact metal layer 28 in a pattern defining the location of the bottom contact power terminal 34. The pattern may be achieved by using a photomask and the like. The bottom contact metal layer containing the photoresist is allowed to cure by soft baking and is subsequently exposed to light causing the photoresist to develop. After the photoresist is developed it is hard baked. The developed areas of the photoresist, which define the notches 30 and 32, are chemically etched to remove the bottom contact metal layer 28, the bottom contact conductive layer 26, and the bottom contact adhesion layer 24, exposing the surface of the base substrate 12. Any excess photoresist material remaining on the bottom contact metal layer 28 after the etching process is completed may be stripped away and the residue removed by using well know etching techniques such as short plasma etching and the like.

FIG. 7 shows the capacitor substrate 10 after a bottom contact metalization layer 36 has been deposited onto the surface of the bottom contact metal layer 28 and etched. A bottom contact metalization layer 36 is deposited onto the etched surface of the bottom contact metal layer 28 and along the walls and floor of the bottom contact notches 30 and 32 by using deposition techniques similar to those described for depositing the back side metalization layers and the bottom contact layers. A preferred method for depositing the bottom contact metalization layer is by sputter deposition. The material chosen for the bottom contact metalization layer 36 should be capable of forming a strong nonconductive oxide film having a relatively high dielectric constant. Suitable materials include tantalum, titanium, niobium, hafnium and the like. A preferred material for the bottom contact metalization layer 36 is tantalum. A preferred bottom contact metalization layer 36 has a thickness of approximately 0.5 micrometers.

The bottom contact metalization layer 36 is etched to remove the metalization material deposited onto the surface of the base substrate 12 forming the floor of the bottom contact notches 30 and 32. The metalization layer may be etched by using selective etching techniques similar to those described for etching the bottom contact layers 25, such as by reactive ion etching, dry etching, chemical etching, photolithographic etching and the like, a preferred etching technique being photolithographic etching.

The bottom contact metalization layer 36 is deposited after the bottom contact notches 30 and 32 have been etched into the bottom contact layer 25, and not before, because applying the bottom contact metalization layer 36 before forming the notches would not result in the placement of the bottom contact metalization material along the walls of the notches 30 and 32. The placement of the metalization material along the walls of the notches, as shown in FIG. 7, is important to the construction of the bypass capacitor because a capacitor in its simplest form comprises a pair of electrically conductive plates separated by a nonconducting insulating material. According to practice of this invention, an insulating layer 38 will be formed at the surface of the bottom contact metalization layer 36 which will later serve to isolate a top contact layer 45 (electrically conductive member) from the bottom contact layer (electrically conductive member), see FIGS. 7 through 10. Without the presence of the metalization material along the walls of the notches, the top and bottom contact layers would come into electrical contact with each other at the walls, and not form a capacitor.

FIG. 8 shows the bypass capacitor substrate 10 after an insulating layer 38 has been formed on the surface of the bottom contact metalization layer 36. The insulating layer is formed in such a manner that selected areas of the bottom contact metalization layer 36, directly above the ground via 16 and the power via 17, remain uncovered to form a ground metalization feedthrough 40 and a power metalization feedthrough 42, respectively. The insulating layer 38 comprises an oxide film which may be formed by selectively oxidizing the bottom contact metalization layer 36 using oxidation techniques well known to those skilled in the art such as by anodizing and the like. A preferred insulating layer 38 is formed by depositing a photoresist material onto the surface of the bottom contact metalization layer 36 at selected locations directly above the ground via 16 and the power via 17. The photoresist may be deposited using deposition techniques well known in the art such as by sputter deposition, chemical vapor deposition, plasma deposition and the like. The specific deposition of the photoresist onto select areas of the bottom contact metalization surface may be achieved by using a photomask and the like. The bottom contact metalization layer containing the photoresist is allowed to cure by soft baking and is subsequently exposed to light causing the photoresist to develop. After the photoresist is developed it is hard baked.

The exposed surface of the bottom contact metalization layer is cleaned using methods well known to those skilled in the art such as vapor degreasing, solvent cleaning and the like. The bottom contact metalization layer is subjected to galvanostatic anodizing, potentiostatic anodizing and is reverse biased to create an oxide film, which forms the insulating layer 38 on the surface of the bottom contact metalization layer 36. The oxide film forming the insulating layer does not, however, form on the surface portion of the bottom contact metalization layer covered with the photoresist material. The photoresist material is stripped away by short plasma etch and the like to uncover the non-oxidized bottom contact metalization surface forming a ground metalization feedthrough 40, located directly above the ground via 16, and a power metalization feedthrough 42, located directly above the power via 17, see FIG. 8.

In a preferred embodiment, the bottom contact metalization layer comprises tantalum (Ta) which, when anodized, forms tantalum pentaoxide ($Ta_2O_5$), a strong non-conducting oxide film. Other suitable oxide films that may serve as the insulating layer 38 include the oxidation products of titanium (titanium dioxide), niobium (niobium pentaoxide) or hafnium (hafnium dioxide). A preferred insulating layer 38 has a thickness in the range of from 0.1 to 0.2 micrometers.

FIG. 9 shows the bypass capacitor substrate 10 after a top contact layer 45 has been deposited onto the surface of the insulating layer 38. The top contact layer 45 is the second electrically conductive member needed in the construction of the capacitor. The top contact layer comprises a top contact adhesion layer 44, a top contact conductive layer 46, and a top contact metal layer 48. A top contact adhesion layer 44 is deposited both onto the surface of the insulating layer 38 and onto the portions of the bottom contact metalization layer 36 forming the ground metalization feedthrough 40 and the power metalization feedthrough 42. The top contact adhesion layer 44 is deposited by using deposition techniques similar to those described for the depositing the bottom contact adhesion layer 24. A preferred deposition technique being by sputter deposition. The material chosen for the top contact adhesion layer 44 may include titanium, tantalum, molybdenum and the like. A preferred material is titanium. A preferred top contact adhesion layer 24 has a thickness of approximately 0.2 micrometers. Like the bottom contact adhesion layer 24, the purpose of the top contact adhesion layer is to form a good interface with the insulating layer 38 when a material such as copper is selected as the material for a top contact conductive layer.

A top contact conductive layer 46 is deposited onto the surface of the top contact adhesion layer 44 by using well known deposition techniques similar to those described for depositing the bottom contact conductive layer 26. Accordingly, the top contact conductive layer may be deposited by using a single deposition technique (i.e., when the desired thickness is less than about two micrometers) or it may be deposited by using a two-step deposition technique (i.e., when the desired thickness is greater than about two micrometers). The material chosen for the top contact conductive layer should have a high electrical conductivity. Suitable materials include metals and alloys of metals. A preferred material for the top contact conductive layer 46 is copper. A preferred top contact conductive layer has a thickness in the range of from two to six micrometers. The top contact conductive layer has a uniform thickness throughout. Therefore, the surface of the conductive layer will be configured similar to that of the top contact adhesion layer 44, having slightly recessed portions corresponding to the recessed portions of the top contact adhesion layer filling the ground metalization feedthrough and the power metalization feedthrough, see FIG. 8.

A top contact metal layer 48 is deposited onto the surface of the top contact conductive layer 46 by using deposition techniques similar to those described for depositing the bottom contact metal layer 28. The material chosen for the top contact metal layer may be the same as that chosen for the bottom contact metal layer 28 and the back side metal layer 22. A preferred top contact metal layer is chromium. The top contact metal layer 28 typically has a thickness of approximately 0.02 micrometers.

FIG. 10 shows the bypass capacitor substrate 10 after a front side ground terminal 50 and a front side power terminal 60 have been formed in the top contact layer 45. The front side ground terminal 50 is made up of a portion of the top contact layer 45 located directly above the ground metalization feedthrough 40 and ground via 16. The front side ground terminal is electrically isolated from the rest of the top contact layer by a pair of ground terminal notches 52 and 54 formed by etching away the top contact layer to expose the surface of the insulating layer 38. The ground terminal notches are formed by using a selective etching technique similar to that described for selectively etching the bottom contact notches 30 and 32 to form the bottom contact power terminal 34. A preferred etching technique is by photolithographic etching. During the etching process the top contact layer 45 is etched completely through to the surface of the insulating layer 38, see FIG. 10. The locations of the ground notches 52 and 54 serve to isolate the portion of the top contact layer, positioned directly over the ground metalization feedthrough 40 and ground via 16, from electrical connection with the portion of the top layer positioned directly over the power metalization feedthrough 42 and power via 17, forming a front side power terminal 60. Electrically isolating the front side ground terminal from the front side power terminal at the top contact layer results in the formation of the capacitor in essentially all areas except the ground terminal.

The front side ground terminal 50 formed in this manner is electrically connected with the back side metalization layers 21 through the top contact layer, the ground metalization feedthrough 40, the bottom contact layer 25, and the ground via 16. Similarly, the front side power terminal 60 formed in this manner is electrically connected with the back side metalization layers 21 through the top contact layer, the power metalization feedthrough 42, the bottom contact power terminal 34, and the power via 17.

FIG. 11 shows the bypass capacitor substrate 10 after the back side metalization layers 21 have been etched to form a back side ground terminal 62 and a back side power terminal 64 to facilitate electrical connection with a printed circuit board and the like. The back side metalization layers are etched by using a selective etching technique similar to that described for etching the bottom and top contact conductive layers, such as reactive ion etching, dry etching, chemical etching, photolithographic etching and the like. A preferred technique for forming the back side ground terminal and back side power terminal is by using a photolithographic etch technique. The back side metalization layers comprising the back side adhesion layer 18, back side conductive layer 20, and back side metal layer 22 are removed from the back side surface of the base substrate except at two locations. The back side metalization layers remain intact at one location directly beneath the ground via 16, forming the back side ground terminal 62, and at a second location directly beneath the power via 17, forming the back side power terminal 64. Before etching the back side metalization layers, the surface of the top contact metal layer 48 is protected from exposure to acids and chemicals used for etching by methods well known to those skilled in the art, such as by coating the surface with grease, yellow or blue tape and the like.

Figure 12:
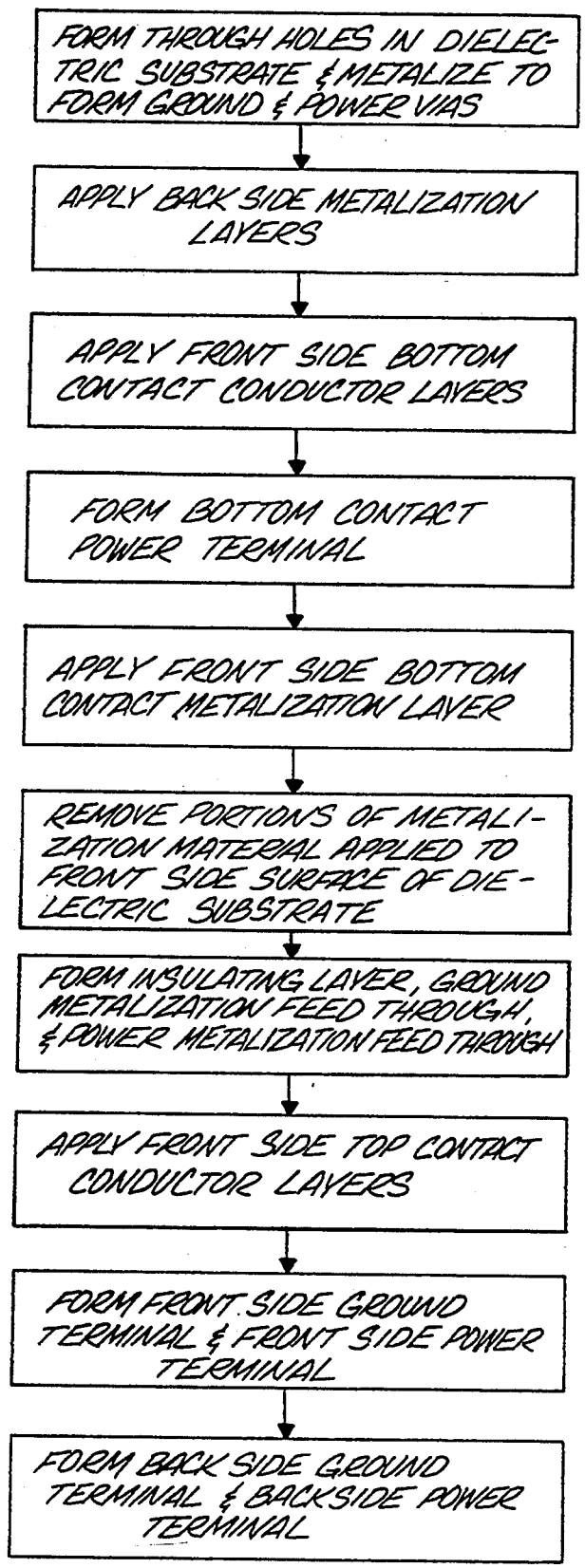
FIG. 12 is a flow chart showing the steps employed in the method of fabricating a preferred embodiment of the thin-film bypass capacitor according to practice of this invention.

FIG. 12 is a flow chart summarizing the step wise method of manufacturing a preferred embodiment of the thin-film bypass capacitor according to the practice of the present invention.

It is to be understood that although only one exemplary embodiment of the thin-film bypass capacitor and one method for manufacturing the same has been described and illustrated herein, many variations will be apparent to those skilled in the art. For example, the method for manufacturing a thin-film bypass capacitor according to the present invention may be used to fabricate bypass capacitors configured differently than the preferred embodiment. A plurality of bypass capacitors may be arranged having a plurality of ground vias and power vias and their respective ground and power terminal, all on a single substrate.

The bypass capacitor of the present invention may also be fabricated having a back side metalization layer 21 comprising only a back side adhesion layer and a back side conductive layer. Instead of using copper for the back side conductive layer, gold may be selected as the conductive metal to be deposited onto the surface of the back side adhesion layer. The physical properties of gold allow it to remain affixed to the back side adhesion layer during successive front side etching operations without the need for depositing a subsequent protective back side metal layer. The gold material may be deposited by using the same deposition techniques described for depositing the back side conductive layer in the preferred embodiment. A preferred thickness of the gold back side conductive layer is approximately one micrometer. The back side metalization layers of this embodiment may be etched in the same manner as the back side metalization layers in the preferred embodiment in order to create the back side ground terminal 62 and back side power terminal 64, see FIG. 11.

The bypass capacitor according to practice of this invention may be fabricated by using an alternative method for depositing the bottom contact metalization layer 36. For example, the bottom contact metalization layer may be deposited onto the surface of the bottom contact metal layer 28 by electroplating, instead of by sputter deposition, see FIG. 7. Depositing the metalization material by electroplating allows the selective deposition of the metalization material only onto electrically conductive surfaces, such as the surface of the bottom contact metal layer 28 and the walls of the bottom contact notches 30 and 32. Deposition by electroplating eliminates the need to perform a subsequent etching operation to remove unwanted metalization material deposited onto the floor of the notches because the metalization material will not deposit onto the nonconductive dielectric substrate surface; see FIG. 7.

The metalization material may be electroplated onto the surface of the bottom contact metal layer after the formation of the bottom contact power terminal 34. After the bottom contact notches 30 and 32 have been etched, the protective coating (i.e., blue or yellow tape) is removed from the surface of the back side metal layer 22 and the bypass substrate 10 is degreased by methods well known in the art and is subjected to cathodic electrocleaning. The front side bottom contact metal layer 28 is subjected to an anodic etching and is dipped in acid. A thickness of material suitable for forming the bottom contact metalization layer 36, such as titanium, tantalum, niobium, hafnium and the like, is electroplated onto the surface of the bottom contact metal layer 28. A preferred material for the bottom contact metalization layer is tantalum. A preferred thickness of the bottom contact metalization layer is approximately 0.5 micrometers.

The bypass capacitor of the present invention may be fabricated by using an alternate method for forming the insulating layer 38. For example, the insulating layer 38 in FIG. 8 may be formed by depositing a thickness of the desired oxide material onto the surface of the bottom contact metalization layer 36 using well known deposition techniques such as sputter deposition, chemical vapor deposition, plasma deposition and the like. The desired insulating layer material may also be formed by depositing a liquid sol-gel solution onto the surface of the bottom contact metal layer by spin-on deposition or spray-on deposition techniques well known in the art. The sol-gel solution applied in this manner subsequently undergoes a soft and then a high temperature baking to form the final desired insulating oxide.

The insulating layer 38 applied according to this alternative embodiment would subsequently be subjected to a selective etching process to form the ground metalization feedthrough 40 and power metalization feedthrough 42 at locations directly above the ground via 16 and power via 17, respectively. The insulating layer may be etched by using well known selective etching techniques such as photolithographic etching described in fabricating the preferred embodiment.

Although the capacitor according to present invention is described in the context of a thin-film bypass capacitor, thin-film capacitors other than bypass capacitors may also be configured according to present invention and are, therefore, understood to be within the scope of the invention.

Since many such variations may be made, it is to be understood that within the scope of the following claims, this invention may be practiced otherwise than specifically described.

What is claimed is:

1. A thin-film capacitor comprising:
   a nonconductive substrate having a back side and a front side;
   a capacitor formed on one side of the substrate, the capacitor having a ground plate and a power plate;
   a ground electrical terminal on the back side of the substrate connected to the ground plate;
   a ground electrical terminal on the front side of the substrate connected to the ground plate;
   a power electrical terminal on the back side of the substrate connected to the power plate; and
   a power electrical terminal on the front side of the substrate connected to the power plate.

2. A thin-film capacitor as recited in claim 1 wherein the capacitor is a bypass capacitor.

3. A thin-film capacitor comprising:
   a nonconductive substrate having at least one electrically conductive ground via and at least one electrically conductive power via extending through the substrate;
   a back side ground terminal on a back side surface of the substrate in electrical connection with the ground via;
   a back side power terminal on a back side surface of the substrate in electrical connection with the power via;
   a bottom contact layer on a front side surface of the substrate;
   a bottom contact metalization layer disposed on the surface of the bottom contact layer;
   an insulating layer on the surface of the bottom contact metalization layer;
   a top contact layer on the surface of the insulating layer;
   a front side ground terminal comprising a portion of the top contact layer in electrical connection with the ground via; and
   a front side power terminal comprising a portion of the top contact layer electrically isolated from the front side ground terminal in electrical connection with the power via.

4. A thin-film capacitor as recited in claim 3 wherein the back side power terminal and back side ground terminal are each made up of a back side metalization layer comprising a back side adhesion layer for providing a bonding surface for a subsequent layer, a back side conductive layer for providing electrical conductivity through the metalization layer, and a back side metal layer for protecting the conductive layer.

5. A thin-film capacitor as recited in claim 4 wherein the bottom contact layer comprises a bottom contact adhesion layer for providing a bonding surface for a subsequent layer, a bottom contact conductive layer for providing electrical conductivity through the bottom contact layer, and a bottom contact metal layer for protecting the conductive layer.

6. A thin-film capacitor as recited in claim 5 wherein the insulating layer is a nonconductive oxide of the bottom contact metalization layer, the insulating layer serving to electrically isolate a portion of the bottom contact layer in electrical contact with the ground via from a portion of the bottom contact layer in electrical contact with the power via.

7. A thin-film capacitor as recited in claim 6 wherein the front side ground terminal and front side power terminal are each made Up of a top contact layer comprising a top contact adhesion layer for providing a bonding surface for a subsequent layer, a top contact conductive layer for providing electrical conductivity through the top contact layer, and a top contact metal layer for protecting the conductive layer.

* * * * *